(12) United States Patent
Mita et al.

(10) Patent No.: US 8,421,117 B2
(45) Date of Patent: Apr. 16, 2013

(54) SEMICONDUCTOR DEVICE AND METHOD OF MANUFACTURING THE SAME

(75) Inventors: Keiji Mita, Isesaki (JP); Kentaro Ooka, Ota (JP)

(73) Assignee: ON Semiconductor Trading, Ltd., Hamilton (BM)

( * ) Notice: Subject to any disclaimer, the term of this patent is extended or adjusted under 35 U.S.C. 154(b) by 115 days.

(21) Appl. No.: 13/159,949

(22) Filed: Jun. 14, 2011

(65) Prior Publication Data
US 2011/0309476 A1 Dec. 22, 2011

(30) Foreign Application Priority Data
Jun. 17, 2010 (JP) .................................. 2010-138105

(51) Int. Cl.
*H01L 29/88* (2006.01)
(52) U.S. Cl.
USPC .................................... 257/106; 257/E29.335
(58) Field of Classification Search .................. 257/106, 257/173, 175, 199, 481, 551, E29.335
See application file for complete search history.

(56) References Cited

U.S. PATENT DOCUMENTS
7,943,959 B2 * 5/2011 Rodrigues ..................... 257/173

FOREIGN PATENT DOCUMENTS
JP 6-29466 2/1994
JP 8-102518 4/1996

* cited by examiner

*Primary Examiner* — Quoc Hoang
(74) *Attorney, Agent, or Firm* — Morrison & Foerster LLP

(57) ABSTRACT

In a semiconductor device including a protection diode for preventing electrostatic breakdown employing a low capacitance protection diode, an occupation area of a Zener diode as a voltage limiting element is not needed on a front surface of a semiconductor substrate. A P+ type embedded diffusion layer is formed in a P+ type semiconductor substrate. This is then covered by a non-doped first epitaxial layer. A high resistivity N type second epitaxial layer is then formed on the first epitaxial layer. The second epitaxial layer is divided by a P+ isolation layer into a first protection diode forming region and a second protection diode forming region. An N+ type embedded layer extending from the front surface of the first epitaxial layer of the first protection diode forming region to the first epitaxial layer and the second epitaxial layer, and so on are then formed. A Zener diode is formed by a P+ type upward diffusion layer extending from the P+ type embedded diffusion layer and the N+ type embedded layer.

5 Claims, 7 Drawing Sheets

ABSTRACT

SEMICONDUCTOR DEVICE AND METHOD OF MANUFACTURING THE SAME

CROSS-REFERENCE OF THE INVENTION

This application claims priority from Japanese Patent Application No. 2010-138105, the content of which is incorporated herein by reference in its entirety.

BACKGROUND OF THE INVENTION

1. Field of the Invention

The invention relates to a semiconductor device including a protection diode for preventing electrostatic breakdown and a method of manufacturing the same, in particular, a semiconductor device relating to a structure of a Zener diode connected between a power supply line and a ground line and a method of manufacturing the same.

2. Description of the Related Art

In recent years, a signal transmission speed between devices such as, for example, a personal computer, a digital camera and so on in which a semiconductor device such as a semiconductor integrated circuit is built is rapidly increasing. Furthermore, device elements or the like forming a semiconductor integrated circuit or the like are being miniaturized day by day so as to increase the speed.

Since the miniaturization of device elements or the like leads to decrease of the electrostatic breakdown resistance to static electricity, semiconductor devices having various types of protection diodes for preventing electrostatic breakdown in semiconductor integrated circuits or the like are also being produced. FIG. 6 shows a protection diode for preventing electrostatic breakdown including first protection diodes 1, second protection diodes 2 and a Zener diode TD.

The first protection diode 1 means each of protection diodes D11, D21, D31 and D41 of which the cathode is connected to a power supply line Vp. The second protection diode 2 means each of protection diodes D12, D22, D32, D42 of which the anode is connected to a ground line Vn. The first protection diode 1 and the second protection diode 2 are connected in series between the power supply line Vp and the ground line Vn.

Terminals CH1 to CH4 are connected to the connecting nodes of the first protection diodes 1 and the second protection diodes 2, respectively. The terminals CH1 to CH4 are connected to corresponding signal lines in a semiconductor integrated circuit. The Zener diode TD is connected between the power supply line Vp and the ground line Vn. Although there are the four terminals CH1 to CH4 in this figure, the number can be increased or decreased according to need.

The operation of the protection diode for preventing electrostatic breakdown having this structure will be briefly described. For example, when high positive static electricity is applied to the signal line connected to the terminal CH1, ordinarily, the static electricity flows to the ground line Vn through the first protection diode D11 in the forward bias state and the Zener diode TD in the breakdown state since the power supply line Vp has a positive potential and the ground line Vn is grounded.

Furthermore, when high negative static electricity is applied to the signal line connected to the terminal CH1, the static electricity directly flows to the ground line Vn through the second protection diode D12 in the forward bias state. When high static electricity is applied to in between the power supply line Vp and the ground line Vn, too, the static electricity flows between the power and ground lines through the Zener diode TD in the breakdown state. Therefore, any static electricity mentioned above does not break the semiconductor integrated circuit or the like through the signal lines.

As the characteristics of the protection diode for preventing electrostatic breakdown, high electrostatic breakdown resistance, low parasitic capacitance, and low parasitic resistance for an instantaneous high current flow are needed. The high electrostatic breakdown resistance is achieved by increasing the size of the protection diode for preventing electrostatic breakdown so as to decrease the density of a current flowing through the PN junction.

In order to increase the signal transmission speed, it is necessary to decrease the parasitic capacitance of the protection diode for preventing electrostatic breakdown. For this, the size reduction of the protection diode for preventing electrostatic breakdown is important. In short, the electrostatic breakdown resistance and parasitic capacitance of the protection diode for preventing electrostatic breakdown are in a trade-off relation for the diode size.

In order to realize such a desired protection diode having high electrostatic breakdown resistance, low parasitic capacitance and low parasitic resistance, it is necessary to increase the area of the protection diode and also form a high resistivity epitaxial layer on a low resistivity semiconductor substrate so as to extend a depletion layer enough when a reverse bias is applied to the protection diode so as to decrease the parasitic capacitance and the parasitic resistance.

In recent years, there is an increasing demand for a protection diode for preventing electrostatic breakdown satisfying the characteristics described above that are harder than conventional. In this case, there is an increasing demand for a dedicated semiconductor device including a protection diode for preventing electrostatic breakdown as shown in FIG. 6 in order to deal with need for a semiconductor substrate of which the resistance is lower than that of an ordinary semiconductor substrate forming a semiconductor integrated circuit or the like or to flexibly deal with static electricity that is irregularly applied to signal terminals such as input and output terminals or the like between devices in which semiconductor devices are built.

An operation principle of a protection diode for preventing electrostatic breakdown is disclosed in the Japanese Patent Application Publication No. Hei 8-102518. An example of reduction of the area of a protection diode for preventing electrostatic breakdown and so on formed on an epitaxial layer in order to protect an internal circuit is disclosed in the Japanese Patent Application Publication No. Hei 6-029466 with a cross-sectional view.

In order to realize the desired first protection diode 1 and second protection diode 2 having high electrostatic breakdown resistance, low parasitic capacitance and low parasitic resistance, there is a method in which a high resistivity epitaxial layer is formed on a low resistivity semiconductor substrate. In detail, a manufacturing method in which an ordinary process of manufacturing a bipolar type integrated circuit is partially modified is used. In this case, ordinarily, like a comparison example shown in FIG. 5 that will be described below, a protection diode for preventing electrostatic breakdown is formed by an ordinary process of manufacturing a bipolar type integrated circuit in which only a photolithographic mask pattern is modified, without an extra process as much as possible.

However, in the protection diode for preventing electrostatic breakdown of the comparison example shown in FIG. 5, the Zener diode TD as a voltage limiting element through which a high current flows cannot avoid having a large occupation area on the front surface of a P+ type semiconductor substrate 1. Therefore, it is necessary to form a protection diode for preventing electrostatic breakdown that does not need the occupation area of the Zener diode TD on the front surface of the P+ type semiconductor substrate 1 and costs low in total.

SUMMARY OF THE INVENTION

The invention provides a semiconductor device, including: a first epitaxial layer formed on a semiconductor layer of a first general conductivity type; a second epitaxial layer of a second general conductivity type formed on the first epitaxial layer; an isolation layer of the first general conductivity type formed in the second epitaxial layer and dividing the second epitaxial layer into a first protection diode forming region and a second protection diode forming region; a second embedded layer of the second general conductivity type extending from the first epitaxial layer to inside the second epitaxial layer in the first protection diode forming region; a first embedded layer of the second general conductivity type formed on a bottom of the second embedded layer; an upward diffusion layer of the first general conductivity type extending from the semiconductor layer to inside the second epitaxial layer through the first epitaxial layer in the second protection diode forming region, and forming a PN junction with a bottom of the first embedded layer; and a Zener diode using the first embedded layer as a cathode layer and the upward diffusion layer as an anode layer.

The invention also provides a method of manufacturing a semiconductor device, including: forming a non-doped first epitaxial layer on a low resistivity semiconductor layer of a first general conductivity type; foaming a high resistivity second epitaxial layer of a second general conductivity type on the first epitaxial layer; forming an isolation layer of the first general conductivity type dividing the second epitaxial layer into a first protection diode forming region and a second protection diode forming region in the second epitaxial layer; forming a second embedded layer of the second general conductivity type extending from the first epitaxial layer to inside the second epitaxial layer in the first protection diode forming region; forming a first embedded layer of the second general conductivity type on a bottom of the second embedded layer; and forming an upward diffusion layer of the first general conductivity type by thermally diffusing impurities in the semiconductor layer, the upward diffusion layer extending to inside the second epitaxial layer through the first epitaxial layer in the second protection diode forming region and forming a PN junction with a bottom of the first embedded layer, wherein the first embedded layer is used as a cathode layer of a Zener diode and the upward diffusion layer is used as an anode layer of the Zener diode.

DETAILED DESCRIPTION OF THE INVENTION

Figure 1A:
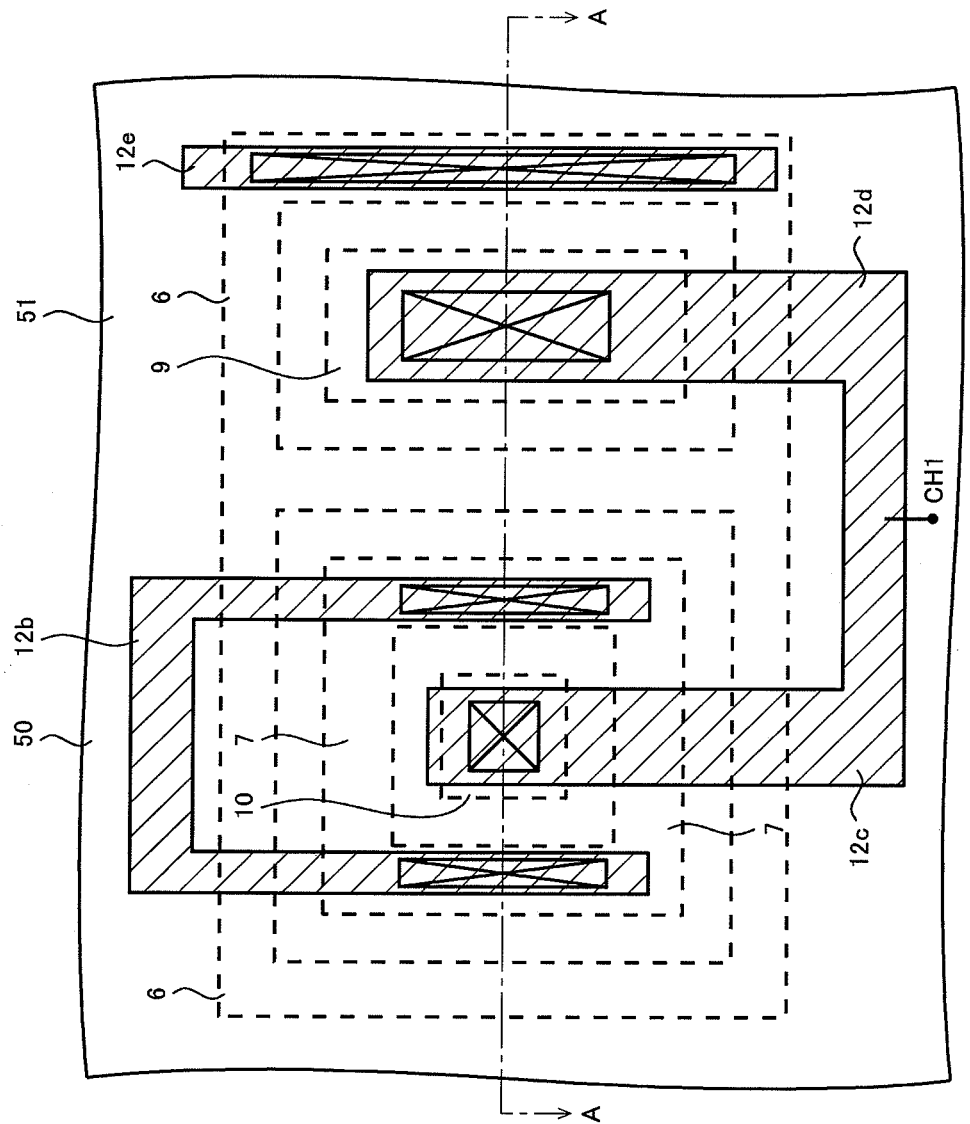
FIG. 1A is a plan view of a semiconductor device of an embodiment of the invention.
Figure 1B:
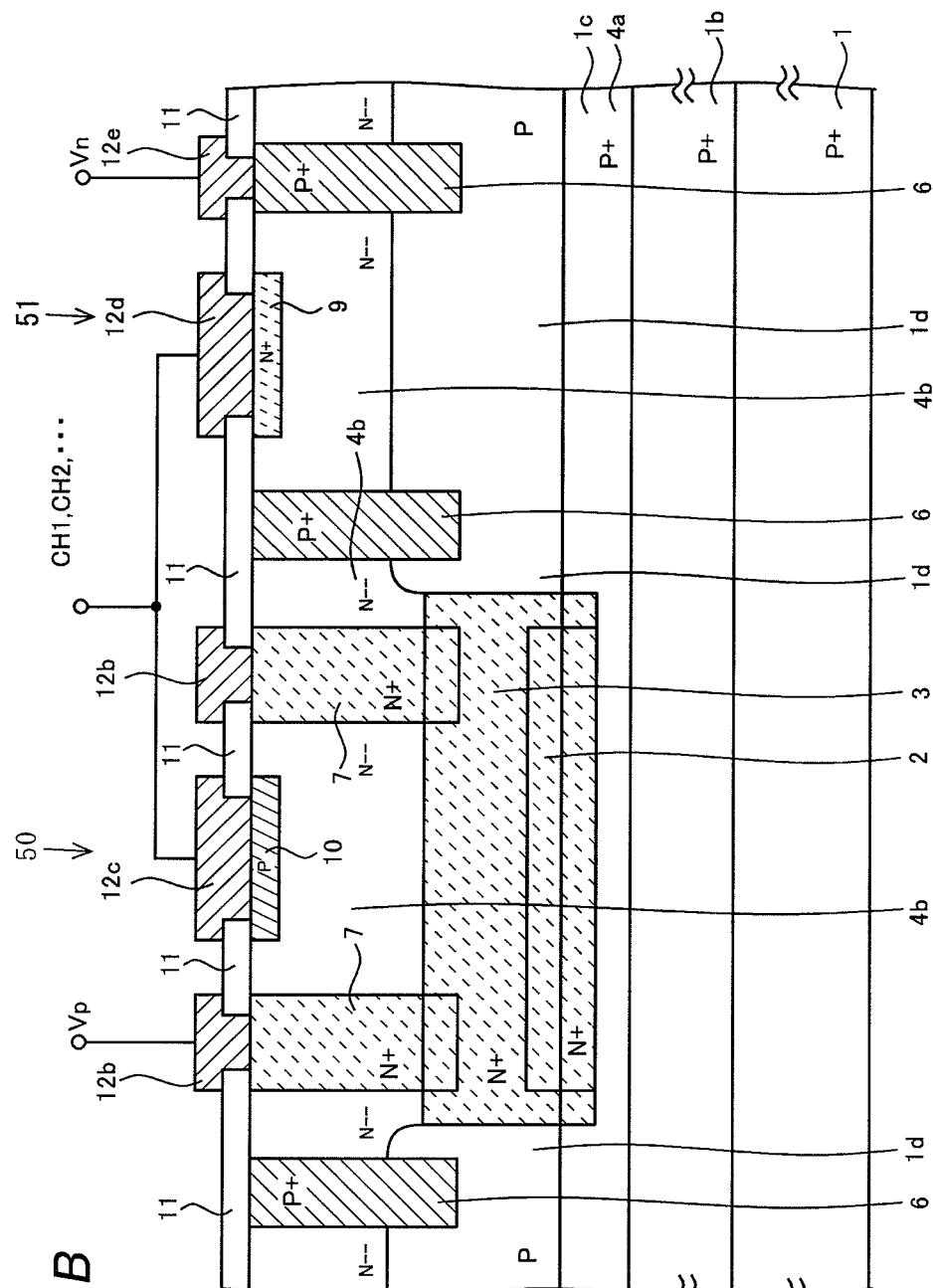
FIG. 1B is a cross-sectional view showing the semiconductor device and a method of manufacturing the same of the embodiment of the invention.

An embodiment of the invention will be described referring to FIG. 1. FIG. 1A is a plan view of the semiconductor device of the embodiment. FIG. 1B is the cross-sectional view of FIG. 1A along line A-A. FIG. 1B is a cross-sectional view showing a semiconductor device and a method of manufacturing the same of the embodiment. This figure shows one of series-connected pairs of a first protection diode 1 and a second protection diode 2, that are connected in parallel as shown in the FIG. 6. Corresponding to the number of signal lines that should be protected from static electricity, the series-connected pairs of the first protection diode 1 and the second protection diode 2 are formed on the left and right sides in this figure in the same manner.

A non-doped first epitaxial layer 4a is formed on a P+ type semiconductor substrate 1 in which a P+ type embedded diffusion layer 1b is formed from the front surface to the inside. A high resistivity second epitaxial layer 4b is formed on the first epitaxial layer 4a. The second epitaxial layer 4b is divided by P+ type isolation layers 6 formed by diffusion from the front surface into a first protection diode forming region 50 in which the first protection diode 1 is formed and a second protection diode forming region 51 in which the second protection diode 2 is formed.

Furthermore, boron (B) is diffused upward from the P+ type embedded diffusion layer 1b to turn the whole first epitaxial layer 4a into a P+ type upward diffusion layer 1c and form a P type upward diffusion layer 1d to the middle of the second epitaxial layer 4b. The P+ type isolation layers 6 are also formed by boron (B) diffused from the P+ type embedded diffusion layer 1b, and connected to the P+ type upward diffusion layer 1c and the P type upward diffusion layer 1d.

Furthermore, a first N+ type embedded layer 2 made of arsenic (As) and a second N+ type embedded layer 3 made of phosphorus (P) that extend from inside the first epitaxial layer 4a to the second epitaxial layer 4b in the first protection diode forming region 50 are formed by ion implantation and thermal diffusion. Since the diffusion speed of arsenic (As) is lower than that of phosphorus (P), the first N+ type embedded layer 2 is formed on the bottom of the second N+ type embedded layer 3. This first N+ type embedded layer 2 forms a PN junction with the P+ type upward diffusion layer 1c.

As shown in the figure, the P type upward diffusion layer 1d is not formed in the second epitaxial layer 4b above the second N+ type embedded layer 3. This is because phosphorus (P) forming the second N+ type embedded layer 3 counteracts the effect of boron (B) of the P type upward diffusion layer 1d. It is noted that conductivity types such as N+, N and N− belong in one general conductivity and conductivity types such as P+, P and P− belong in the other general conductivity.

An N+ type cathode layer 7 of the first protection diode 1 that extends from the front surface of the second epitaxial layer 4b to inside the second N+ type embedded layer 3 is formed in the second epitaxial layer 4b in the first protection diode forming region 50. A P type anode layer 10 of the first protection diode 1 is formed adjacent to the N+ type cathode layer 7 in the front surface of this second epitaxial layer 4b. An N+ type cathode layer 9 of the second protection diode 2 is formed in the front surface of the second epitaxial layer 4b in the second protection diode forming region 51.

Furthermore, a cathode electrode 12b and an anode electrode 12c are formed so as to be respectively connected to the N+ type cathode layer 7 and the P type anode layer 10 of the first protection diode 1 through contact holes formed in an insulation film 11 covering the second epitaxial layer 4b and so on in which the P type anode layer 10 and so on of the first protection diode 1 described above are formed.

In the same manner, a cathode electrode 12d connected to the N+ type cathode layer 9 of the second protection diode 2 and an anode electrode 12e connected to the P+ type isolation layer 6 that is an anode layer are formed. A multilayer wiring structure is formed on an interlayer insulation film and so on (not shown) formed on the P+ type semiconductor substrate 1 on which the cathode electrode 12d and so on are formed, and a passivation film made of a silicon nitride film or the like is formed as the topmost layer.

As a result, the first protection diode 1 including the N+ type cathode layer 7, the P type anode layer 10 and so on is formed in the first protection diode forming region 50. Furthermore, the Zener diode TD as a voltage limiting element shown in FIG. 6 that uses the first N+ type embedded layer 2 as the N+ type cathode layer and uses the P+ type upward diffusion layer 1c as the P+ type anode layer is formed immediately under the first protection diode 1 in the first protection diode forming region 50. Furthermore, the second protection diode 2 including the N+ type cathode layer 9 and the P+ type anode layer formed of the P+ type isolation layer 6 is formed in the second protection diode forming region 51.

The cathode electrode 12b of the first protection diode 1 is connected to the power supply line Vp, and the anode electrode 12e of the second protection diode 2 is connected to the ground line Vn. The anode electrode 12c of the first protection diode 1 and the cathode electrode 12d of the second protection diode 2 are connected to each other and connected to a signal line CH1 or the like. As a result, a semiconductor device including a protection diode for preventing electrostatic breakdown shown in FIG. 6 is formed.

Differing from the case of the comparison example shown in FIG. 5 that will be described below, the occupation area of the Zener diode TD as a voltage limiting element is not needed on the front surface of the second epitaxial layer 4b. In detail, the layers under the first protection diode 1 in the first protection diode forming region 50 are effectively used for forming the Zener diode TD.

As a result, a protection diode for preventing electrostatic breakdown is formed for each of the signal lines, having the series connection protection diodes in which the first protection diode 1 and the second protection diode 2 are connected in series and the Zener diode TD under the first protection diode 1 in the first protection diode forming region 50. Therefore, compared with the comparison example in which the Zener diode TD is formed on the front surface of the P+ type isolation layer 6 as shown in FIG. 5, the size of the die is reduced by this amount. As the number of signal lines that should be protected is more increased, the reduction effect of the die size is more enhanced. This is a first feature of the invention.

Figure 5:
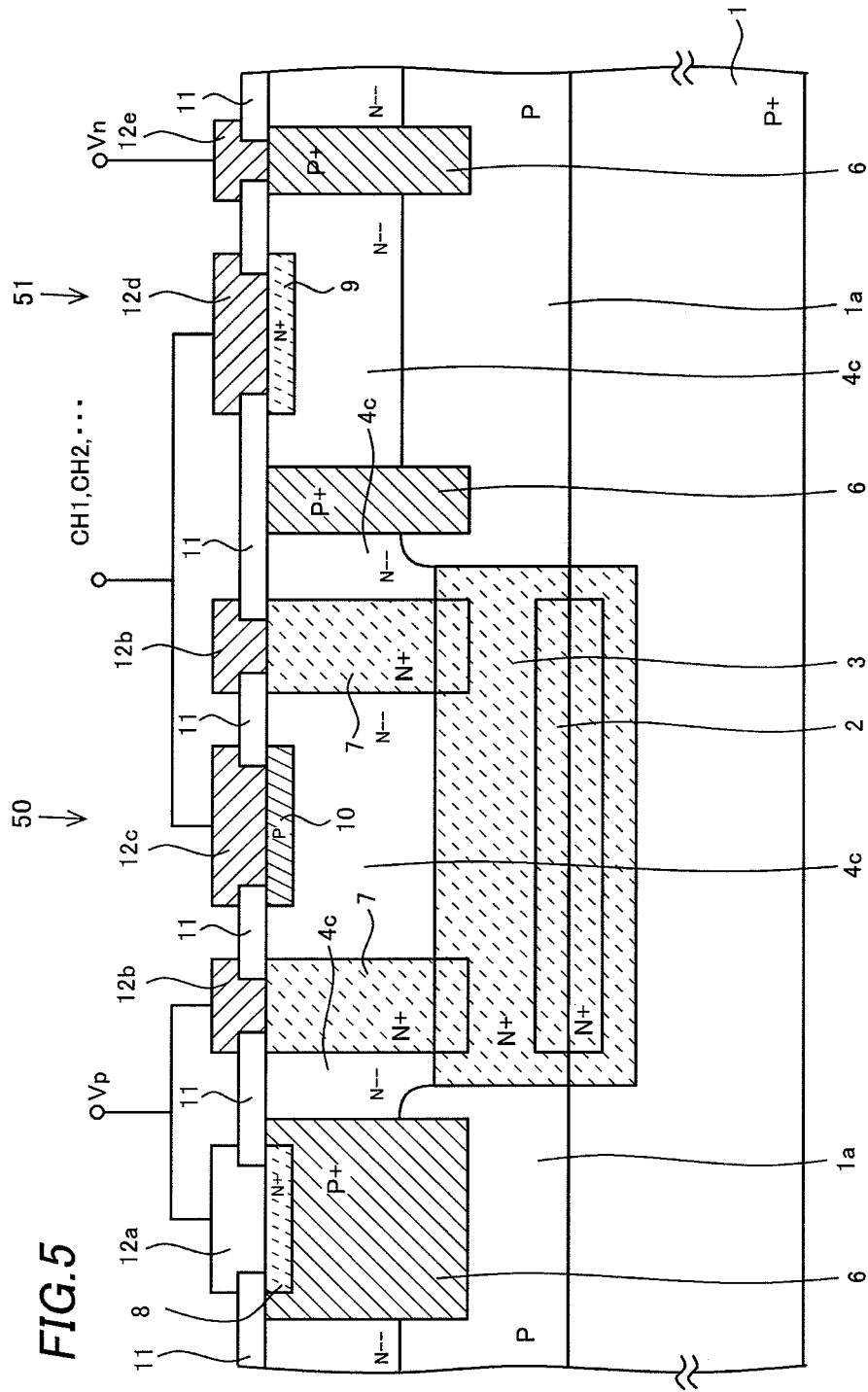
FIG. 5 is a cross-sectional view showing a semiconductor device and a method of manufacturing the same of a comparison example.
Figure 6:
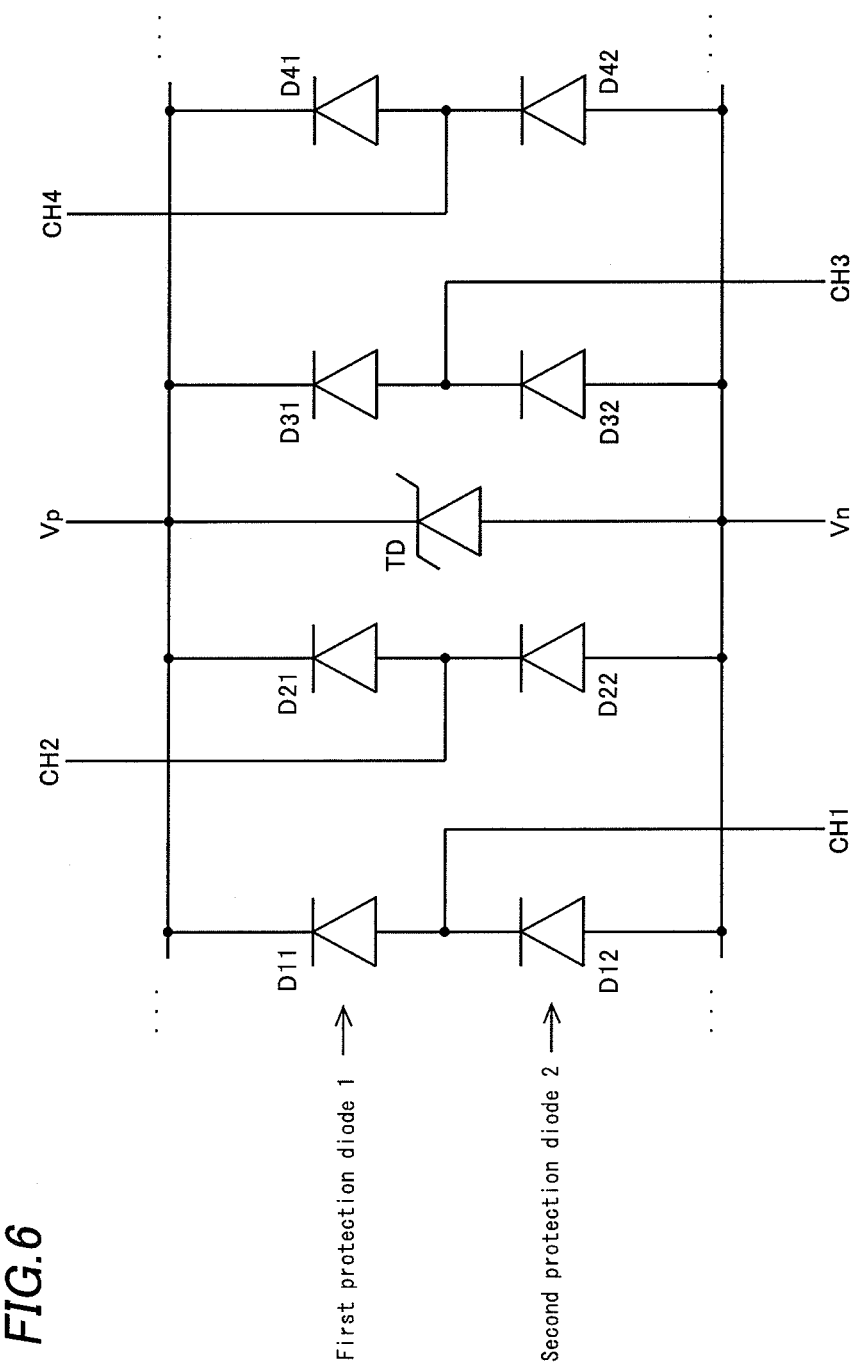
FIG. 6 is a diagram showing a structure of a protection diode for preventing electrostatic breakdown.

Ordinarily, a semiconductor device including a protection diode for preventing electrostatic breakdown employs a structure in which one Zener diode TD or the like is provided for a plurality of series-connected pairs of a first protection diode 1 and a second protection diode 2 as shown in FIG. 6, instead of providing a Zener diode TD or the like for each of the series-connected pairs of the first protection diode 1 and the second protection diode 2. The die size reduction effect of the invention relative to this case is smaller than the effect relative to the comparison example shown in FIG. 5 in which one Zener diode TD or the like covers one series-connected pair of the first protection diode 1 and the second protection diode 2.

However, in the structure shown in FIG. 6, the operation of the Zener diode TD may delay when high static electricity is applied to a signal line connected to a series-connected pair of the first protection diode 1 and the second protection diode 2 disposed at a long distance from the Zener diode TD. On the other hand, in the embodiment, the Zener diode TD is provided in each of the series-connected pairs of the first protection diode 1 and second protection diode 2, and thus a prompt response is achieved. This is a second feature of the invention.

Furthermore, the P+ type embedded diffusion layer 1b having higher impurity concentration than the P+ type semiconductor substrate 1 is formed on the P+ type semiconductor substrate 1, and the P+ type upward diffusion layer 1c having high concentration is formed by diffusion of boron (B) from the P+ type embedded diffusion layer 1b. The parasitic resistance of the protection diode is decreased by this, and this is a third feature of the invention.

Furthermore, as described below, the non-doped first epitaxial layer 4a is formed on the P+ type semiconductor substrate 1 in which the P+ type embedded diffusion layer 1b is formed, and the first N+ type embedded layer 2 made of arsenic (As) and the second N+ type embedded layer 3 made of phosphorus (P) are formed on the first epitaxial layer 4a. Phosphorus (P) forming the second N+ type embedded layer 3 counteracts the effect of boron (B) diffused from the P+ type embedded diffusion layer 1b as described above. As a result of this, it is prevented that the P type upward diffusion layer 1d is formed in the second epitaxial layer 4b above the second N+ type embedded layer 3, and this is a fourth feature of the invention.

Figure 2:
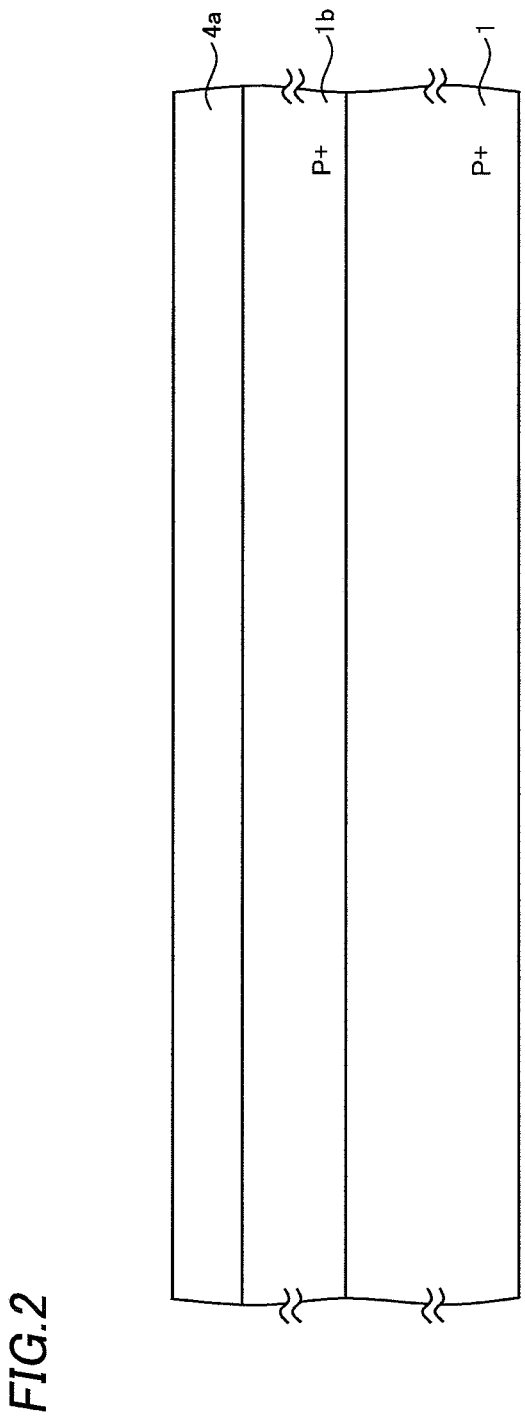
FIGS. 2 to 4 are cross-sectional views showing the method of manufacturing the semiconductor device of the embodiment of the invention.

Hereafter, a method of manufacturing the semiconductor device of the embodiment will be described referring to FIG. 1 and FIGS. 2 to 4. First, as shown in FIG. 2, the P+ type semiconductor substrate 1 is provided. The resistivity of the P+ type semiconductor substrate 1 is lower than a resistivity used for an ordinary bipolar integrated circuit by about double digits. This is to decrease the parasitic resistance of the protection diode.

Then boron (B) is thermally diffused from the front surface of the P+ type semiconductor substrate 1 in a high temperature furnace using boron tribromide ($BBr_3$) or the like as an impurity source to form the P+ type embedded diffusion layer 1b. Instead of $BBr_3$ or the like, boron (B) may be ion-implanted and driven therein in a high temperature furnace. The front surface impurity concentration of the P+ type embedded diffusion layer 1b after the thermal diffusion is high and twice the impurity concentration of the P+ type semiconductor substrate 1 or more.

The object of forming the high concentration P+ type embedded diffusion layer 1b is to obtain a desired value of the breakdown voltage of the Zener diode TD formed by the first N+ type embedded layer 2 and so on that will be described below and the P+ type upward diffusion layer 1c made of boron (B) diffused from the P+ type embedded diffusion layer 1b as well as to decrease the parasitic resistance of the protection diode. Although there is a method in which the impurity concentration of the P+ type semiconductor substrate 1 is more increased instead of forming the P+ type embedded diffusion layer 1b, from an aspect of the variation of the breakdown voltage of the Zener diode TD and so on, it is preferable to form the P+ type embedded diffusion layer 1b.

Then the non-doped first epitaxial layer 4a having a predetermined thickness in which impurities are not doped is formed by a predetermined epitaxial method on the P+ type semiconductor substrate 1 in which the P+ type embedded diffusion layer 1b is formed.

Figure 3:
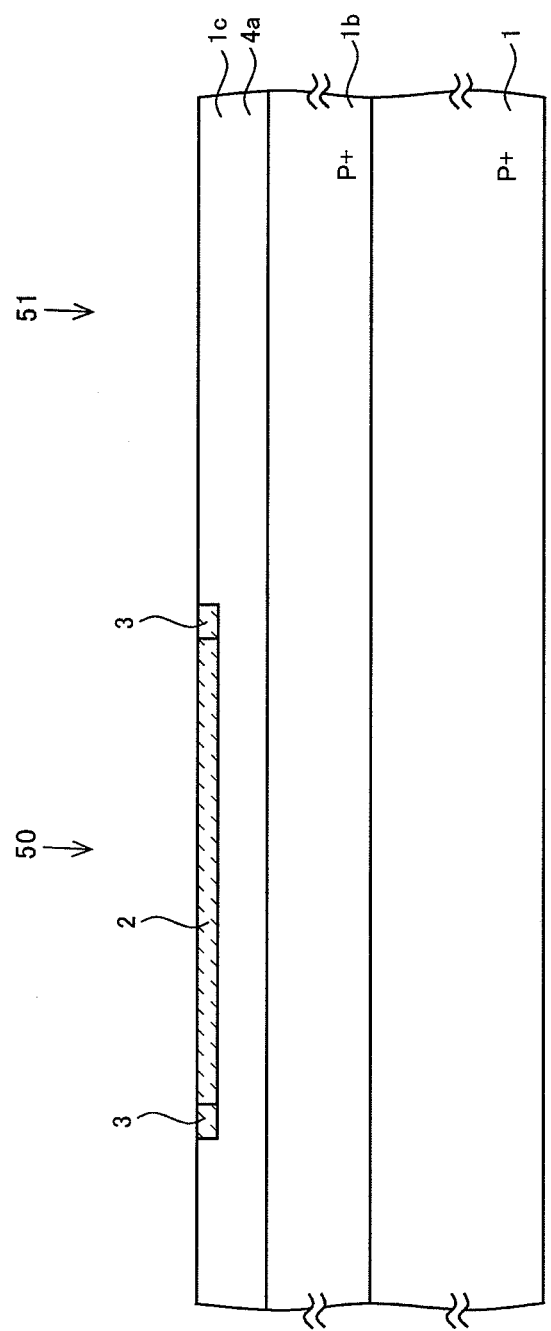

Then, as shown in FIG. 3, the first N+ type embedded layer 3 is formed in a predetermined region of the first epitaxial layer 4a in the first protection diode forming region 50 by ion implantation of a high dose of phosphorus (P) by a predetermined method using a silicon thermal oxide film or the like as a mask (not shown). Furthermore, the second N+ type embedded layer 2 is superposingly formed by ion implantation of a higher dose of arsenic (As) than that of phosphorus (P) by a digit.

A heat treatment is then performed in a high temperature furnace to diffuse the first N+ type embedded layer 2 made of arsenic (As) and the second N+ type embedded layer 3 made of phosphorus (P) in the first epitaxial layer 4a. At this time, boron (B) is also thermally diffused from the P+ type embedded diffusion layer 1b to form the P+ type upward diffusion layer 1c in the first epitaxial layer 4a.

The first N+ type embedded layer 2 thermally diffused from the upper surface of the first epitaxial layer 4a and the P+ type upward diffusion layer 1c thermally diffused from the lower surface form a PN junction at the junction surface, thereby forming the Zener diode TD as the voltage limiting element of the protection diode for preventing electrostatic breakdown as shown in FIG. 6.

The breakdown voltage of the Zener diode TD can be lower than that of the case of the comparison example that will be described below. In detail, by optimizing the impurity concentration of the P+ type embedded diffusion layer 1b that serves as the diffusion source for the P+ type upward diffusion layer 1c, the Zener diode TD having a desired breakdown voltage is formed.

Figure 4:
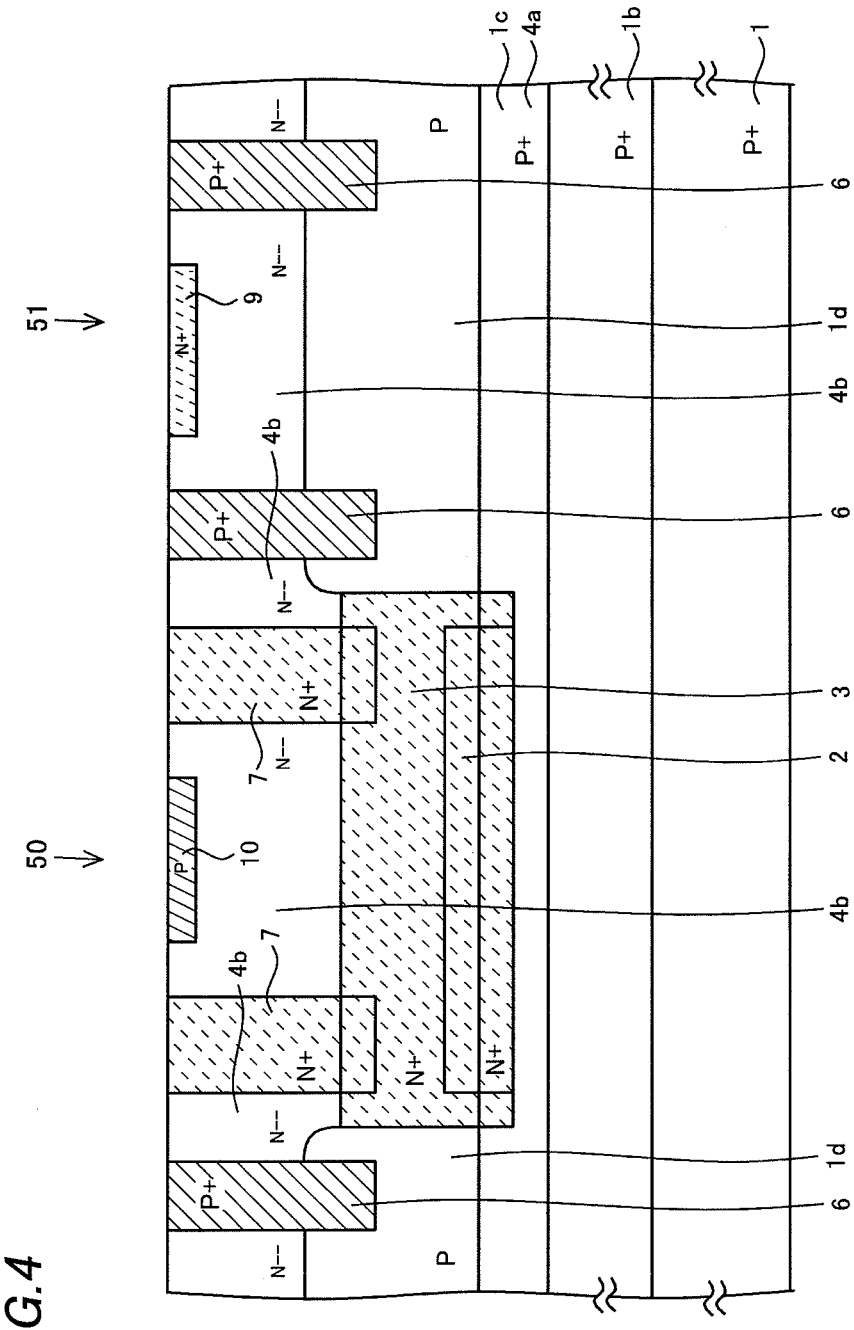

Then, as shown in FIG. 4, the high resistivity N type second epitaxial layer 4b covering the whole surface of the first epitaxial layer 4a in which the first N+ type embedded layer 2 and so on are formed is formed by a predetermined epitaxial method. When the second epitaxial layer 4b is formed, it is noted that the back surface of the P+ type semiconductor substrate 1 need be back-sealed enough with an insulation film or the like so as to avoid auto-doping of the second epitaxial layer 4b with boron (B) emitted from the P+ type semiconductor substrate 1 having high impurity concentration.

Then the N+ type cathode layer 7 is formed in a predetermined region of the first protection diode forming region 50 from the front surface of the second epitaxial layer 4b to inside the second N+ type embedded layer 3 that is thermally diffused toward the upper portion of the second epitaxial layer 4b. The N+ type cathode layer 7 is formed by ion implantation of phosphorus (P) or thermal diffusion using phosphorus oxychloride (POCl$_3$) or the like as an impurity source using a silicon thermal oxide film or the like as a mask.

At this time, simultaneously, the P+ type isolation layer 6 dividing the second epitaxial layer 4b into the first protection diode forming region 50 and the second protection diode forming region 51 is formed from a predetermined region of the front surface of the second epitaxial layer 4b. The P+ type isolation layer 6 is formed by ion implantation of boron (B) or thermal diffusion of boron (B) using boron tribromide (BBr$_3$) as an impurity source using a silicon thermal oxide film (not shown) or the like as a mask.

Although only one pair of the first protection diode forming region 50 and the second protection diode forming region 51 is shown in this figure, there are a plurality of signal terminals that should be protected and thus a plurality of same pairs are actually formed accordingly.

In each of the heat treatment processes, by boron (B) diffused from the P+ type embedded diffusion layer 1b into the first epitaxial layer 4a, the whole non-doped first epitaxial layer 4a is converted to the P+ type upward diffusion layer 1c made of a high concentration of boron (B). Furthermore, boron (B) is also diffused from the P+ type upward diffusion layer 1c into the second epitaxial layer 4b to form the P type upward diffusion layer 1d in the second epitaxial layer 4b except above the second N+ type embedded layer 3.

Ordinarily, the P+ type isolation layer 6 described above is formed from both of its upper and lower sides respectively, the lower side being formed of a boron diffusion layer that is upwardly diffused from an embedded boron (B) layer (not shown) formed on the first epitaxial layer 4a. However, in the embodiment, the lower side of the P type isolation layer 6 is formed using boron (B) that is upwardly diffused from the high concentration P+ type embedded diffusion layer 1b formed on the P+ type semiconductor substrate 1 at the same time as when the P+ type upward diffusion layer 1c and the P type upward diffusion layer 1d are formed.

Arsenic (As) of the first N+ type embedded layer 2 and phosphorus (P) of the second N+ type embedded layer 3 are also diffused in the second epitaxial layer 4b. The region of the second epitaxial layer 4b above the second N+ type embedded layer 3 is not converted to the P type since the effect of phosphorus (P) forming the second N+ type embedded layer 3 counteracts the effect of boron (B) that is upwardly diffused from the P+ type upward diffusion layer 1c.

Then the P type anode layer 10 of the first protection diode 1 is formed in the second epitaxial layer 4b in the first protection diode forming region 50 by ion implantation of boron (B) or the like using an insulation film (not shown) such as a silicon oxide film as a mask. The N type cathode layer 9 of the second protection diode 2 is then formed in the second epitaxial layer 4b in the second protection diode forming region 51 by ion implantation of phosphorus (P) or the like using an insulation film (not shown) such as a silicon oxide film as a mask.

Then, as shown in FIG. 1B, the insulation film 11 such as a silicon thermal oxide film is formed on the second epitaxial layer 4b in which the N type cathode layer 9 and so on are formed. The contact holes are then formed in the insulation film 11 by a predetermined photo-etching treatment and a metal film such as aluminum (Al) is formed on the whole front surface thereof by a predetermined sputtering method or the like.

Then, by a predetermined photo-etching treatment, the cathode electrode 12b connected to the N+ type cathode layer 7 of the first protection diode 1, the anode electrode 12c connected to the P type anode layer 10, and the cathode electrode 12d connected to the N+ type cathode layer 9 of the second protection diode 2, and the anode electrode 12e connected to the P+ type isolation layer 6 as the P type anode layer through the contact holes are formed. Finally, a passivation protection film made of a silicon nitride film or the like is formed, thereby completing the semiconductor device of the embodiment in the wafer state.

As described above, the cathode electrode 12b is connected to the power supply line Vp, the anode electrode 10 and the cathode electrode 9 are connected and united and connected to the signal line CH1 or the like, and the anode electrode 12e is connected to the ground line Vn. Furthermore, the first N+ type embedded layer 2 as the cathode layer of the Zener diode TD is connected to the power supply line Vp though the second N+ type embedded layer 3 and the N+ type cathode layer 7, and the P+ type embedded layer 1c as the anode layer is connected to the ground line Vn through the P+ type isolation layer 6. With this structure, the predetermined electrostatic breakdown protection diode is formed.

Comparison Example

FIG. 5 is a cross-sectional view showing a semiconductor device including a protection diode for preventing electrostatic breakdown as a comparison example formed by a process of manufacturing a bipolar type integrated circuit in which only a photo mask pattern is modified, and a method of manufacturing the same. A difference from an ordinary process of manufacturing a bipolar type integrated circuit is that the resistivity of a P+ type semiconductor substrate 1 is lower by double digits or more, a second N+ type embedded layer 3 is provided, and an epitaxial layer 4c is formed as a high resistivity layer, like in the embodiment.

The reason for providing the second N+ type embedded layer 3 is to prevent boron (B) diffused from the P+ type semiconductor substrate 1 from forming a P type upward diffusion layer 1a in the epitaxial layer 4c in the first protection diode forming region 50. In detail, phosphorus (P) forming the second N+ type embedded layer 3 is used so as to counteract the effect of boron (B) diffused from the P+ type semiconductor substrate 1, preventing the forming of the P type upward diffusion layer 1a.

A first difference from the embodiment is that there does not exist one equivalent to the P+ type embedded diffusion layer 1b of the embodiment in the P+ type semiconductor substrate 1. As a result, the breakdown voltage of a PN junction formed by the first N+ type embedded layer 2 and so on of the first protection diode forming region 50 and the P+ type semiconductor substrate 1 is largely higher than the supply voltages of devices using a semiconductor device including a semiconductor integrated circuit and so on. Therefore, when a Zener diode TD as a voltage limiting element is formed using this PN junction, devices cannot be protected enough from static electricity.

Although the Zener diode TD having a desired breakdown voltage may be formed by increasing the impurity concentration of the P+ type semiconductor substrate 1, in this case the amount of diffusion of boron (B) from the P+ type semiconductor substrate 1 into the epitaxial layer 4c increases to cause a problem that a P type layer exists in the epitaxial layer 4c above the second N+ type embedded layer 3. Furthermore, there is a problem that the amount of boron (B) mixed into the epitaxial layer 4c due to auto-doping increases.

Therefore, in the comparison example, the Zener diode TD is formed by an ordinary process of manufacturing a bipolar type integrated circuit in which only the photo mask pattern is modified taking the modification described above into account. In detail, the large area of N+ type cathode layer 8 of the Zener diode TD is formed on the P+ type isolation layer 6 as the anode layer of the Zener diode TD. The Zener diode TD formed of the P+ type isolation layer 6 and the N+ type cathode layer 8 has a breakdown voltage suitable for supply voltages used in devices.

In this case, since a current at several ten amperes may flow through the Zener diode TD instantaneously, the area of the N+ type cathode layer 8 need be large and the width of the P+ type isolation layer 6 in the protection diode forming region on which the N+ type cathode layer 8 is formed also becomes large. Therefore, there is a disadvantage that the die size increases accordingly. As the number of signal lines that should be protected is more, the number of the necessary Zener diodes TD need be more.

The method of manufacturing the semiconductor device of the comparison example is the same as that of the embodiment only except that the P+ type embedded diffusion layer 1b and the non-doped first epitaxial layer 4a are not formed. Only the photo mask pattern of the N+ type cathode layer 8 is modified, and the N+ type cathode layer 8 is formed at the same time as when the N+ type cathode layer 9 is formed.

The invention realizes forming the Zener diode TD as a voltage limiting element under the first protection diode 1. Therefore, the occupation area of the Zener diode TD is not needed on the front surface of the P+ type semiconductor substrate 1 and the die size is decreased accordingly, thereby decreasing the total manufacturing cost.

What is claimed is:

1. A semiconductor device, comprising:
    a first epitaxial layer of a first general conductivity type formed on a semiconductor layer of the first general conductivity type;
    a second epitaxial layer of a second general conductivity type formed on the first epitaxial layer;
    an isolation layer of the first general conductivity type formed in the second epitaxial layer and dividing the second epitaxial layer into a first protection diode forming region and a second protection diode forming region;
    a first embedded layer of the second general conductivity type extending from the first epitaxial layer toward the second epitaxial layer in the first protection diode forming region;
    a second embedded layer of the second general conductivity type extending from a bottom of the first embedded layer so as to connect to the second epitaxial layer in the first protection diode forming region;
    a PN junction formed with the first embedded layer and the first epitaxial layer in the first protection diode forming region;
    an upward diffusion layer of the first general conductivity type extending from the semiconductor layer so as to connect to the second epitaxial layer in the second protection diode forming region; and
    a Zener diode formed with the PN junction, using the first embedded layer as a cathode layer and the first epitaxial layer as an anode layer.

2. The semiconductor device of claim 1, wherein the first protection diode forming regions and the second protection diode forming regions are alternately disposed.

3. The semiconductor device of claim 1, further comprising a first protection diode comprising a cathode layer of the second general conductivity type extending from the second embedded layer formed in the first protection diode forming region to a front surface of the second epitaxial layer and an anode layer of the first general conductivity type formed in the front surface of the second epitaxial layer adjacent to the cathode layer, and a second protection diode comprising a cathode layer of the second general conductivity type formed in the front surface of the second epitaxial layer in the second protection diode forming region and an anode layer of the first general conductivity type comprising the isolation layer and the upward diffusion layer.

4. The semiconductor device of claim 3, wherein the cathode layer of the first protection diode is connected to a power supply line, the anode layer of the second protection diode is connected to a ground line, the anode layer of the first protection diode and the cathode layer of the second protection diode are connected to a same signal line, the cathode layer of the Zener diode is connected to the power supply line, and the anode layer of the Zener diode is connected to the ground line.

5. The semiconductor device of claim 1, wherein the semiconductor layer is an embedded diffusion layer of the first general conductivity type in which impurities are diffused in a semiconductor substrate of the first general conductivity type from the front surface.

* * * * *